(12) United States Patent
Buhler et al.

(10) Patent No.: US 7,183,651 B1
(45) Date of Patent: Feb. 27, 2007

(54) POWER PLANE DECOUPLING

(75) Inventors: Otto Richard Buhler, Boulder, CO (US); Kevin Michael Horn, Brighton, CO (US)

(73) Assignee: Storage Technology Corporation, Louisville, CO (US)

( * ) Notice: Subject to any disclaimer, the term of this patent is extended or adjusted under 35 U.S.C. 154(b) by 0 days.

(21) Appl. No.: 10/868,685

(22) Filed: Jun. 15, 2004

(51) Int. Cl.
*H01L 29/00* (2006.01)
*H01L 23/48* (2006.01)
*H01L 23/52* (2006.01)
*H01L 29/40* (2006.01)

(52) U.S. Cl. ...................................... 257/758; 257/532
(58) Field of Classification Search ................ 257/532, 257/758
See application file for complete search history.

(56) References Cited

U.S. PATENT DOCUMENTS

| 6,100,594 | A | 8/2000 | Fukui et al. |
| 6,229,217 | B1 | 5/2001 | Fukui et al. |
| 6,352,879 | B1 | 3/2002 | Fukui et al. |
| 6,353,263 | B1 | 3/2002 | Dotta et al. |
| 6,353,540 | B1 * | 3/2002 | Akiba et al. ................ 361/794 |
| 2002/0085334 | A1 * | 7/2002 | Figueroa et al. ......... 361/301.4 |

FOREIGN PATENT DOCUMENTS

JP  2000-269407  9/2000

OTHER PUBLICATIONS

U.S. Appl. No. 10/428,013, filed May 2003, Fukui et al.

* cited by examiner

*Primary Examiner*—Cuong Nguyen
(74) *Attorney, Agent, or Firm*—Brooks Kushman P.C.

(57) ABSTRACT

A system and method for improved power plane decoupling. In a preferred embodiment, two dielectric layers with different dielectric constants are separated by a first conducting layer. Second and third conducting layers are positioned outside the two dielectric layers, forming a conductor-dielectric-conductor-dielectric-conductor stack. The two outer conducting layers contact each other periodically through vias made in the conducting layers, adding high dielectric constant capacitance to the plane structure for short time intervals. The lower dielectric constant material provides high propagation speed coupling to the high dielectric constant material.

12 Claims, 2 Drawing Sheets

POWER PLANE DECOUPLING

BACKGROUND OF THE INVENTION

1. Field of the Invention

The present invention relates generally to decoupling the power-ground voltages of integrated circuits, and particularly to an improved buried capacitance for decoupling.

2. Background of the Invention

As frequencies in high speed electronic devices increase, decoupling power-ground voltages for devices becomes more challenging. Integrated circuits (ICs) require high frequency current for their operation. The current requirements for devices must be identified to properly assess the decoupling and power distribution requirements. The charging and discharging of capacitors is typically used to provide the needed supply for devices.

Often, electronic devices are mounted onto printed circuit boards (PCBs). A PCB power distribution system must provide sufficient current for the circuitry of devices on the PCB to operate. This includes high peak current requirements during output switching. The power distribution system must supply this current while maintaining the input supply voltage needed by devices.

To achieve this, discrete capacitors are often placed near the devices. These capacitors are connected between the power and ground planes to provide the necessary charge current to the devices. For example, these capacitors discharge their current into the device and quickly recharge from energy stored in slower discharging capacitors and power supplies prior to the next required discharge as needed by the device. The frequencies provided are often much higher than the IC primary clock frequency.

At high frequencies, power-ground planes and ceramic decoupling capacitors and a bulk decoupling capacitor are often used in combination. But as the required frequency increases, the ceramic decoupling capacitors must be located closer to the IC or other device they are decoupling.

To remedy this issue, buried capacitance was invented to alleviate the need for ceramic decoupling capacitors. Buried capacitance uses a combination of a thin dielectric material between power and ground planes and dielectric material with a relatively high dielectric constant. However, buried capacitance alone usually does not have the required current supply versus frequency response characteristics, and ceramic decoupling capacitors are usually still required.

SUMMARY OF THE INVENTION

The present invention teaches an improvement to power plane decoupling by creating a buried capacitance structure with two layers of different dielectric constant materials. In one example embodiment, the structure comprises two layers of dielectric materials, the two layers separated by a conducting layer between them with conducting layers above and below. Preferably, one of the conducting layers (e.g., the one between the dielectric layers) has voltage applied thereto, while the other two (in this example, the ones above and below the dielectric layers) are grounded. Vias cut through the middle conducting layer allow the two outer conducting layers to contact one another, creating a periodic structure that adds high dielectric constant capacitance to the plane structure for short time intervals, thus providing higher effective capacitance for those short time intervals. Other embodiments are described more fully below.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
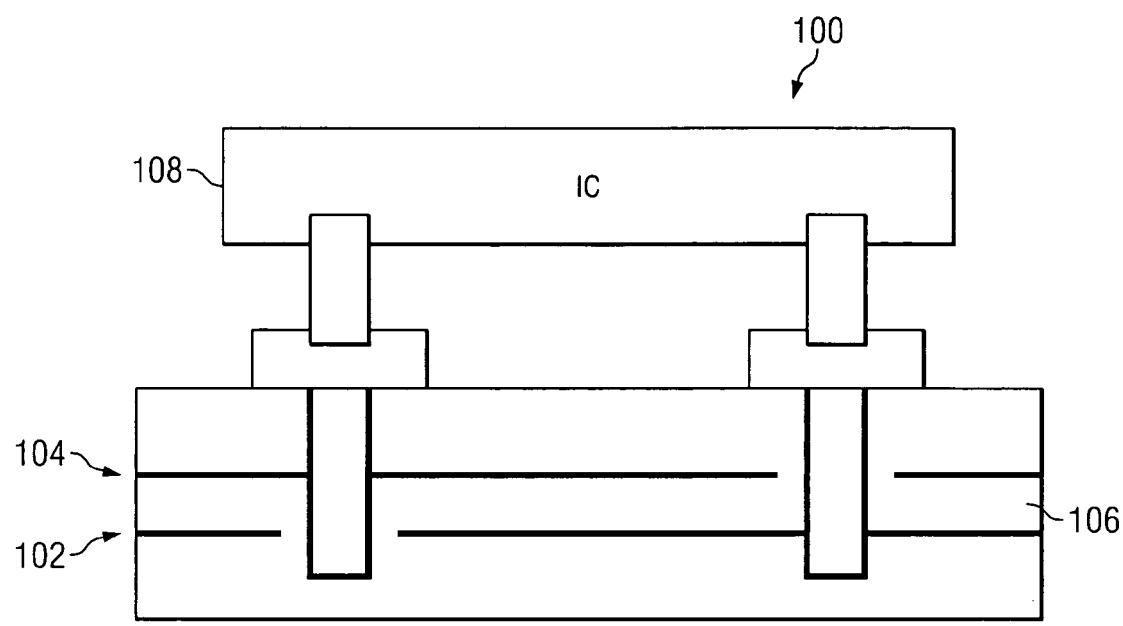
FIG. 1 shows a prior art buried capacitance structure.

FIG. 1 shows a typical power-ground plane construction according to the prior art, shown in the context of printed circuit board (PCB) 100 and device 108 (such as an integrated circuit) mounted thereon. In this example, the PCB 100 is composed of two planes 102, 104, for example, within a printed circuit board. One plane 102 is ground while plane 104 is power. Between planes 102, 104 is sandwiched a dielectric layer 106. These layers create a buried capacitance structure used for decoupling device 108 attached to printed circuit board 100. In this example, device 108 has one connection to power plane 104 and one connection to ground plane 102. In typical prior art structures, ground and power planes 102, 104 are formed of a conductor such as copper.

Figure 2:
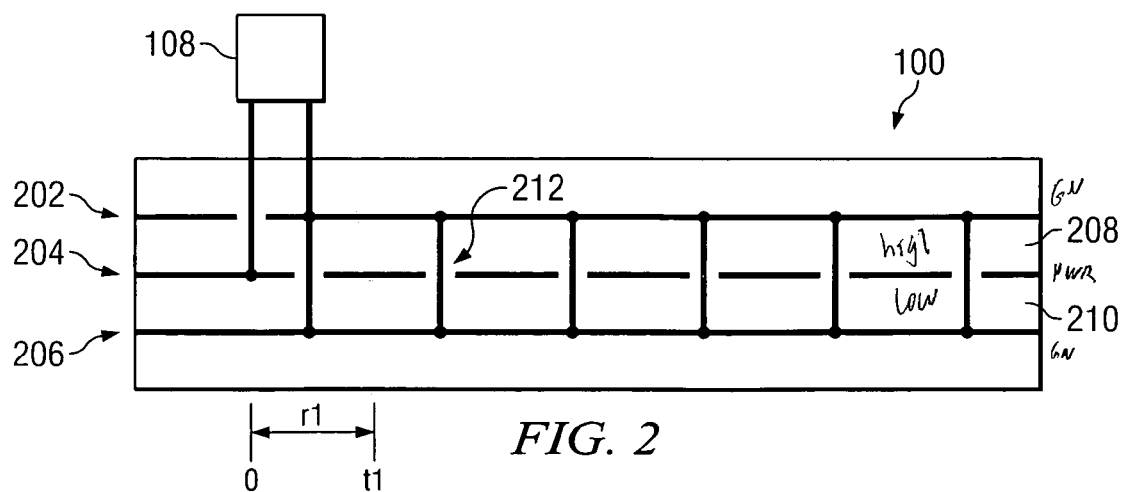
FIG. 2 shows a side view of a power plane decoupling structure according to a preferred embodiment.

FIG. 2 shows a power plane (for example, in PCB 100) with buried capacitance structure according to a preferred embodiment, seen from a side view. In this preferred embodiment, there are three conducting layers, namely ground 202, power 204, and ground 206. Power 204 is preferably made of copper and is sandwiched between two dielectric layers 208, 210. Upper dielectric layer 208 is, in this example, a high dielectric constant material, while lower dielectric layer 210 is a low dielectric constant material. At intervals, vias 212 are formed to connect conducting layer 202 with conducting layer 206. Vias 212 connect high dielectric constant capacitance formed in 208 with low dielectric constant capacitance formed in 210. Device 108 is shown connected to power 204 and ground 202, 206 planes.

In this preferred embodiment, the load (IC 108) is decoupled by the innovative power-ground plane structure. The high dielectric constant layer 208 has an effective capacitance radius of r1 in time interval t1, meaning the decoupling electromagnetic (EM) wave in the material travels radius r1 in time t1. In this example, t1 is ⅙ the rise time of the logic element being decoupled. By adding an additional layer of dielectric, namely low dielectric constant layer 210, the low dielectric constant layer 210 acts as a high speed decoupling distribution layer that periodically taps into high dielectric constant layer 208—at each via 212. The innovative structure provides advantages over prior structures in that high dielectric constant layer 208 provides high capacitance (and slower decoupling EM wave propagation), while low dielectric constant layer 210 provides lower capacitance but higher decoupling EM wave propagation. The vias, which permit contact between the two dielectric layers, allows the present invention to periodically provide the advantages of both types of material, namely, high capacitance and high decoupling wave propagation.

Figure 3:
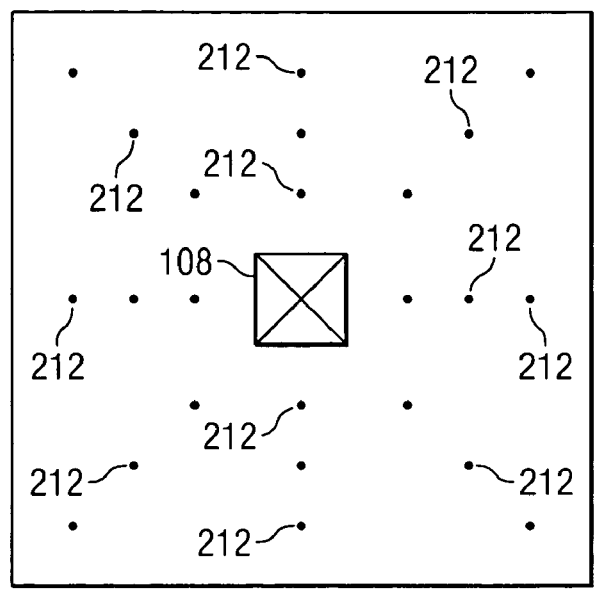
FIG. 3 shows a top view of a grid of vias relative to a device on a printed circuit board according to a preferred embodiment of the present invention.

FIG. 3 shows a top view layout of the innovative system. This example shows the two-dimensional grid or array of vias surrounding a device. The vias, shown as dots, provide physical contact between the two dielectric layers described above.

Device 108 is shown surrounded on four sides by vias 212. In this example, vias 212 are placed on four sides of device 108. Three vias 212 are shown on each side of device 108. This example is intended to show extension of the idea presented above in two dimensions as it can be implemented, for example, on a PCB. Depending on needs and economics, a finer grid construction can be used.

Figure 4:
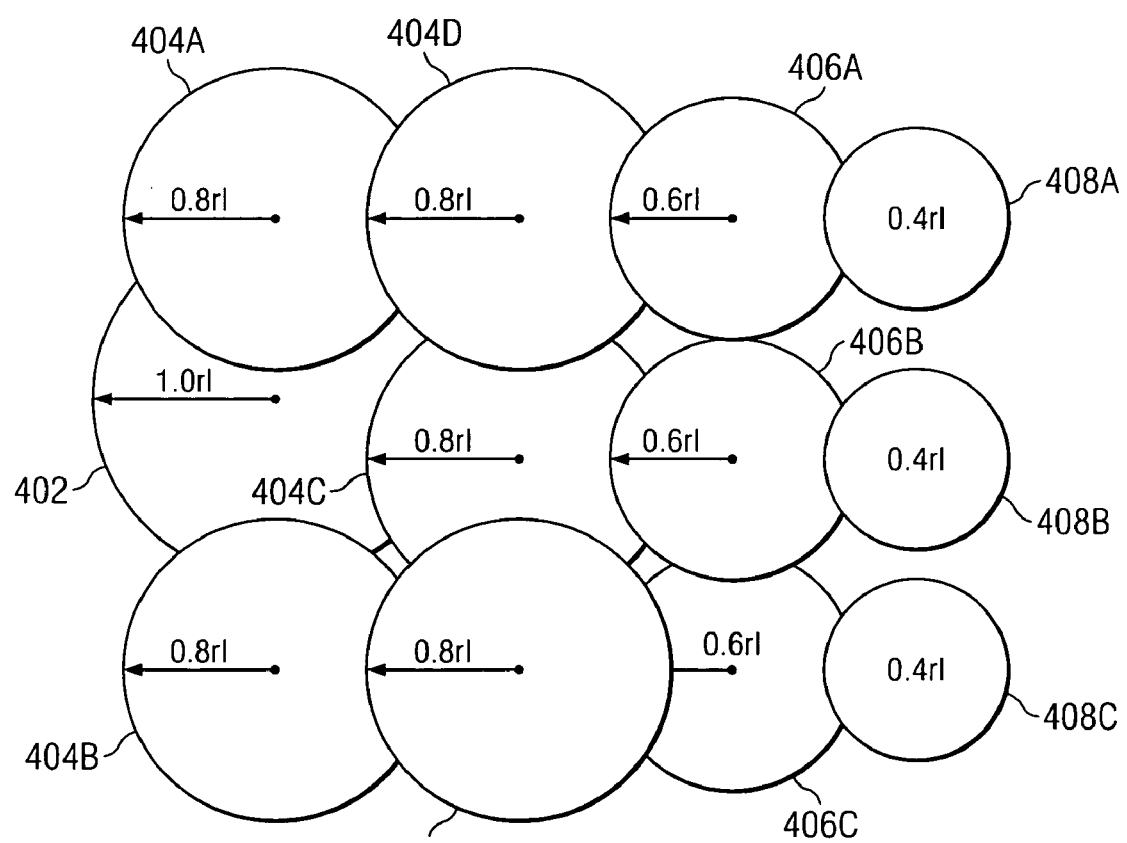
FIG. 4 shows a top view of the system, depicting the effective capacitance radii provided by the vias, according to a preferred embodiment of the present invention.

FIG. 4 shows the system from the view used in FIG. 3, but FIG. 4 shows the radii for the effective capacitance in time interval t1. Circle 402 represents the radii for the effective capacitance for the area directly beneath the device on the PCB, and has radius r1. Radii 404A–404E represent the radii for effective capacitance at vias, which are placed at the centers of these circles, respectively, in a grid pattern for example. These have radii of 0.8 r1. As the diagram extends to the right, another row of vias is represented by radii 406A–406C, with radii 0.6 r1. A third row of vias is represented by circles 408A–408C, with radii 0.4 r1. The signal through the high dielectric constant material propagates a distance r1 in time t1, as depicted in FIG. 2. This signal travels further in a shorter time period. This allows the present system to tap into the higher dielectric constant material and obtain more effective total capacitance in a given amount of time, because the signal (i.e., the supply current) sees not only the high dielectric constant material, but also the low dielectric constant material, by virtue of the vias.

As shown in the above figures, the present invention improves the decoupling speed of the system by providing a buried capacitance structure that combines two dielectric layers which periodically intersect or connect with one another at vias cut through a conducting layer. It is noted that the spacing of vias need not necessarily be uniform. In preferred embodiments, the three conducting layers (i.e., layers 202, 204, and 206 of FIG. 2) can include two grounds on either side of a hot plane, or two hot planes on either side of a ground. Likewise, the arrangement for low and high constant dielectrics described above can be varied, with the low constant dielectric being positioned above or below the high constant dielectric material. Other variations on this system are possible while still being within the innovative concepts described herein.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A system for decoupling power-ground voltages from a device in an electronic circuit, the system comprising:
first, second, and third conducting layers each having a planar configuration, wherein the first and third conducting layers are at the same electric potential and the second conducting layer is at a different electric potential;
wherein the device is positioned at a given location above a portion of the first conducting layer, wherein the device is electrically connected by a first connection to at least one of the first and third conducting layers and is electrically connected by a separate second connection to the second conducting layer;
a first dielectric layer having a planar configuration between the first and second conducting layers, the first dielectric layer having a first dielectric constant;
a second dielectric layer having a planar configuration between the second and third conducting layers, the second dielectric layer having a second dielectric constant, wherein the first and second dielectric constants are different;
wherein a plurality of electrically conductive vias cut through the second conductive layer provide electrical contact between the first and third conducting layers and the first and second dielectric layers, wherein each via has a structure, wherein the plurality of vias are arranged in an array such that the vias surround the given location of the device underneath the portion of the first conducting layer, and wherein the array and the structures of the plurality of vias create a plurality of radii for the effective capacitance of the plurality of vias.

2. The system of claim 1, wherein the first and third conducting layers are at ground, and wherein the second conducting layer is not at ground.

3. The system of claim 1, wherein the first and third conducting layers are not at ground, and wherein the second conducting layer is at ground.

4. The system of claim 1, wherein the first dielectric constant is higher than the second dielectric constant.

5. The system of claim 1, wherein the device includes an integrated circuit.

6. A printed circuit board for decoupling power-ground voltages from a device positioned at a given location on a portion of the printed circuit board, the printed circuit board comprising:
a first conducting layer having planar configuration;
a first dielectric layer having a planar configuration atop the first conducting layer;
a second conducting layer having a planar configuration atop the first dielectric layer, the second conducting layer having a connection for electrically connecting with a first terminal of the device;
a second dielectric layer having a planar configuration atop the second conducting layer;
a third conducting layer having a planar configuration atop the second dielectric layer;
wherein at least one of the first and third conducting layers have a connection for electrically connecting with a second terminal of the device;
wherein the first and third conducting layers are at the same electric potential and the second conducting layer is at a different electric potential;
wherein the first dielectric layer and the second dielectric layer have different dielectric constants;
a plurality of vias cut through the second conducting layer, wherein the vias are arranged in a grid such that the vias surround the given location of the device underneath the portion of the printed circuit board; and
wherein the first and third conducting layers and the first and second dielectric layers electrically contact one another at the plurality of vias, wherein each via has a structure, and wherein the array and the structures of the plurality of vias create a plurality of radii for the effective capacitance of the plurality of vias.

7. The system of claim 1, wherein the first dielectric constant is lower than the second dielectric constant.

8. The printed circuit board of claim 6, wherein the first and third conducting layers are at ground, and wherein the second conducting layer has voltage applied thereto.

9. The printed circuit board of claim 6, wherein the first and third conducting layers have voltage applied thereto, and wherein the second conducting layer is at ground.

10. A system for decoupling power-ground voltages from a device in an electronic circuit, the system comprising:

first, second, and third conducting layers, wherein the first and third conducting layers are at the same electric potential and the second conducting layer is at a different electric potential;

wherein the device is positioned at a given location above a portion of the first conducting layer, wherein the device is electrically connected by a first connection to at least one of the first and third conducting layers and is electrically connected by a separate second connection to the second conducting layer;

a first dielectric layer between the first and second conducting layers;

a second dielectric layer between the second and third conducting layers, wherein the dielectric layers have different dielectric constants; and a plurality of vias each electrically connecting the first and third conducting layers and the first and second dielectric layers, wherein the vias each pass through the dielectric layers and the second conductive layer without contacting the second conductive layer, wherein the vias are arranged in a grid such that the vias surround the given location of the device underneath the portion of the first conducting layer.

11. The system of claim 10 wherein:

the first and third conducting layers are grounded.

12. The system of claim 10 wherein:

the second conducting layer is grounded.

* * * * *